United States Patent
Yoon

(10) Patent No.: US 8,049,229 B2
(45) Date of Patent: Nov. 1, 2011

(54) LIGHT EMITTING DIODE AND METHOD FOR MANUFACTURING THE SAME

(75) Inventor: Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 77 days.

(21) Appl. No.: 12/173,383

(22) Filed: Jul. 15, 2008

(65) Prior Publication Data

US 2009/0194779 A1  Aug. 6, 2009

(30) Foreign Application Priority Data

Feb. 1, 2008 (KR) .................. 10-2008-0010784

(51) Int. Cl.
*H01L 33/06* (2010.01)
(52) U.S. Cl. ............... 257/88; 257/99; 257/E33.001; 257/E33.062; 257/E33.006
(58) Field of Classification Search ......... 257/E33.005, 257/E33.006, E33.007, E33.011, E33.023, 257/E33.067, 98, E33.001, E33.062, 88, 257/99; 438/27, 34, 39
See application file for complete search history.

(56) References Cited

U.S. PATENT DOCUMENTS

| | | | | | |
|---|---|---|---|---|---|
| 5,912,475 | A | * | 6/1999 | Itagaki et al. | 257/94 |
| 5,977,565 | A | * | 11/1999 | Ishikawa et al. | 257/81 |
| 2001/0024460 | A1 | * | 9/2001 | Yamamoto et al. | 372/36 |
| 2002/0017651 | A1 | * | 2/2002 | Kato et al. | 257/89 |
| 2005/0029536 | A1 | * | 2/2005 | Sugitatsu et al. | 257/103 |
| 2006/0157718 | A1 | * | 7/2006 | Seo et al. | 257/82 |
| 2006/0220057 | A1 | * | 10/2006 | Shim et al. | 257/103 |
| 2006/0231852 | A1 | * | 10/2006 | Kususe et al. | 257/99 |
| 2007/0145391 | A1 | * | 6/2007 | Baik et al. | 257/94 |
| 2008/0105885 | A1 | * | 5/2008 | Watanabe et al. | 257/96 |

* cited by examiner

*Primary Examiner* — Jarrett Stark
*Assistant Examiner* — Michele Fan
(74) *Attorney, Agent, or Firm* — H.C. Park & Associates, PLC

(57) ABSTRACT

A light emitting diode includes a current leakage passage electrically connected in parallel to an active layer to better protect the light emitting diode from static electricity. The light emitting diode includes a substrate, an n-type nitride semiconductor layer on the substrate, an active layer on the n-type nitride semiconductor layer, a p-type semiconductor layer on the active layer, a p-electrode on the p-type semiconductor layer, and an n-electrode formed from the n-type semiconductor layer, exposed by etching, to a portion of the p-type semiconductor layer.

15 Claims, 3 Drawing Sheets

LIGHT EMITTING DIODE AND METHOD FOR MANUFACTURING THE SAME

CROSS REFERENCE TO RELATED APPLICATION

This application claims priority from and the benefit of Korean Patent Application No. 10-2008-0010784, filed on Feb. 1, 2008, which is hereby incorporated by reference for all purposes as if fully set forth herein.

BACKGROUND OF THE INVENTION

1. Field of the Invention

The present invention relates to a light emitting diode with an improved protection function for electrostatic discharge impact. More particularly, the present invention relates to a light emitting diode that has a current leakage passage electrically connected in parallel to an active layer to protect the light emitting diode from the static electricity and to provide better reliability in anti-electrostatic performance.

2. Discussion of the Background

Light emitting diodes (LEDs) are devices that convert an electric current into light when the current is input forward into an active layer of the devices. For emitting infrared rays, red light, and the like, the LED is formed of chemical compounds such as InP, GaAs, GaP, and the like. Further, a GaN-based semiconductor has been developed as a material for an LED for emitting ultraviolet rays, blue light, or green light.

To prevent generation of crystal defects, the GaN-based semiconductor is generally grown by an epitaxy process on a sapphire substrate, which has similar crystal structure and lattice constant as those of the semiconductor. Since sapphire is an insulator, electrode pads for the LED are formed on a grown surface of an epitaxial layer. However, for a substrate made of an insulator such as sapphire, it is difficult to prevent electrostatic discharge (ESD) caused by static electricity injected from the outside. As a result, the LED may be damaged by the electrostatic discharge, which reduces reliability of the LED. Thus, when packaging the LED, a separate Zenor diode is mounted along with the LED to prevent ESD.

FIG. 1A is a schematic cross-sectional view of a flip-chip LED with a Zenor diode on a sub-mount to prevent ESD damage, and FIG. 1B is an equivalent circuit diagram of the flip-chip LED shown in FIG. 1A. Referring to FIG. 1A, a semiconductor light emitting device includes an LED 125 and a Zenor diode 155, which is connected in parallel to the LED 125 and formed on a sub-mount 151. The LED 125 includes an n-type semiconductor layer (for example, n-GaN) 103 on a sapphire substrate 101, an active layer 105 on the n-type semiconductor layer 103, a p-type semiconductor layer (for example, p-GaN) 107 on the active layer 105, an n-electrode 111 on the n-type semiconductor layer 103, and a p-electrode 109 on the p-type semiconductor layer 107. The Zenor diode 155 can be formed by injecting, for example, p-type ions into a portion of the sub-mount 151 such as an n-type silicon substrate to form a p-type silicon region 153. In the LED 125, the n-electrode 111 is connected to the p-type silicon region 153 via a first conductive bump 113, and the p-electrode 109 is connected to the sub-mount 151 such as the n-type silicon substrate via a second conductive bump 115, followed by flip chip bonding. If ESD voltage is applied through input/output terminals (not shown) of the semiconductor light emitting device shown in FIG. 1A, most discharge current flows through the Zenor diode 155 connected in parallel to the LED 125, as also shown in FIG. 1B. With this configuration, the LED 125 can be protected from inadvertent application of the ESD voltage.

For the light emitting device shown in FIG. 1A, formation of the Zenor diode 155 on the sub-mount 151 requires an expensive ion-injection process and a diffusion process that is difficult to control, thereby leading to a complex process and an increased cost in manufacturing the sub-mount 151.

For not only the flip chip LED described above but also general surface emission LEDs, using the Zenor diode increases the number of processes and manufacturing costs for packaging the LED along with the Zenor diode, and makes it more difficult to arrange the LED and the Zenor diode in the package.

SUMMARY OF THE INVENTION

This invention provides an LED that has a current passage electrically connected in parallel to an active layer to protect the LED from static electricity, which can be applied to the LED from the outside, without using a Zenor diode.

This invention also provides an LED that has a current passage created by formation of an electrode and electrically connected in parallel to an active layer, wherein contact resistance and contact area between the electrode and semiconductor layers is changed, thereby improving drive conditions and providing a more reliable anti-static electricity function.

Additional features of the invention will be set forth in the description which follows, and in part will be apparent from the description, or may be learned by practice of the invention.

The present invention discloses a light emitting diode, which includes a substrate, an n-type nitride layer, an active layer, a p-type nitride layer, and an n-electrode arranged on an exposed portion of the n-type nitride layer and a portion of the p-type nitride layer to form a current passage connected in parallel to the active layer.

In order to improve operation and to provide a more reliable anti-static electricity function of the LED, plasma surface treatment is performed to alter the surface resistance and contact area of the n-electrode contacting the portion of the p-type nitride layer so that the electric resistance of the current passage connected in parallel to the active layer can be controlled.

The present invention discloses a method for manufacturing a LED that includes: forming an n-type semiconductor layer on a sapphire substrate; forming an active layer on the n-type semiconductor layer; forming a p-type semiconductor layer on the active layer; exposing a portion of the n-type semiconductor layer; forming a p-electrode on the p-type semiconductor layer; and forming an n-electrode extending from the exposed n-type semiconductor to a portion of the p-type semiconductor where the p-electrode is not formed, to form a current passage connected in parallel to the active layer.

The exposing a portion of the n-type semiconductor layer may include forming a photoresist pattern; reflowing the photoresist pattern to achieve a circular shape by heating; and removing a portion of the n-type semiconductor layer by dry etching with the circular photoresist pattern as an etching mask such that an etching surface of the n-type semiconductor layer is formed into an inclined surface including the active layer.

The method may further include performing plasma treatment on the exposed n-type semiconductor layer, the active layer exposed through the etching surface, and the portion of the p-type semiconductor layer where the p-electrode is not formed.

The forming of an n-electrode may include changing a contact area of the n-type semiconductor layer contacting the n-electrode and changing a contact area of the p-type semiconductor layer contacting the n-electrode.

The present invention also discloses a flip chip LED formed by attaching an n-electrode and a p-electrode of the LED to a sub-mount, wherein the LED is manufactured by forming an n-type semiconductor layer on a sapphire substrate; forming an active layer on the n-type semiconductor layer; forming a p-type semiconductor layer on the active layer; exposing a portion of the n-type semiconductor layer; forming the p-electrode on the p-type semiconductor layer; forming a reflection plate on the p-electrode; and forming the n-electrode extending from the exposed n-type semiconductor to a portion of the p-type semiconductor where the p-electrode is not formed.

The present invention also discloses a method for manufacturing a LED that includes: forming a p-type semiconductor layer on a sapphire substrate; forming an active layer on the p-type semiconductor layer; forming an n-type semiconductor layer on the active layer; exposing a portion of the p-type semiconductor layer; forming an n-electrode on the n-type semiconductor layer; and forming a p-electrode extending from the exposed p-type semiconductor to a portion of the n-type semiconductor where the n-electrode is not formed, to form a current passage connected in parallel to the active layer.

The exposing of a portion of the p-type semiconductor may include forming a photoresist pattern; reflowing the photoresist pattern into a circular shape by heating; and removing a portion of the p-type semiconductor layer by dry etching with the circular photoresist pattern as an etching mask such that an etching surface of the p-type semiconductor layer is formed into an inclined surface including the active layer.

The method may further include performing plasma treatment on the exposed p-type semiconductor layer, the active layer exposed through the etching surface, and the portion of the n-type semiconductor layer where the n-electrode is not formed.

The forming of the p-electrode may include changing a contact area of the p-type semiconductor layer contacting the p-electrode, and changing a contact area of the n-type semiconductor layer contacting the p-electrode.

Alternatively, a flip chip LED may be provided by attaching an n-electrode and a p-electrode of a LED to a sub-mount, wherein the LED is manufactured by forming a p-type semiconductor layer on a sapphire substrate; forming an active layer on the p-type semiconductor layer; forming an n-type semiconductor layer on the active layer; exposing a portion of the p-type semiconductor layer; forming the n-electrode on the n-type semiconductor layer; forming a reflection plate on the n-electrode; and forming the p-electrode extending from the exposed p-type semiconductor to a portion of the n-type semiconductor where the n-electrode is not formed.

The present invention also discloses a LED that includes: an n-type semiconductor layer on a sapphire substrate; an active layer on the n-type semiconductor layer; a p-type semiconductor layer on the active layer; a p-electrode on the p-type semiconductor layer; and an n-electrode extending from the n-type semiconductor layer exposed by etching to a portion of the p-type semiconductor layer where the p-electrode is not formed, to form a current passage connected in parallel to the active layer.

The n-electrode may include an inclined etching surface between the n-type semiconductor layer and the p-type semiconductor layer, and may extend from the n-type semiconductor layer to the portion of the p-type semiconductor layer where the p-electrode is not formed.

The n-electrode may be formed by plasma treatment of the n-type semiconductor layer, the active layer exposed through the etching surface, and the portion of the p-type semiconductor layer where the p-electrode is not formed, such that electric resistance of contact areas of the n-type and p-type semiconductor layers contacting the n-electrode can be changed.

The n-electrode may be formed by changing a contact area of the n-type semiconductor layer to the n-electrode and changing a contact area of the p-type semiconductor layer to the n-electrode.

Alternatively, a flip chip LED may be provided by attaching the n-electrode and the p-electrode of the LED having the current passage connected in parallel to the active layer to a sub-mount.

The present invention also discloses an LED that includes: a p-type semiconductor layer on a sapphire substrate; an active layer on the p-type semiconductor layer; an n-type semiconductor layer on the active layer; an n-electrode on the n-type semiconductor layer; and a p-electrode extending from the p-type semiconductor layer exposed by etching to a portion of the n-type semiconductor layer, where the n-electrode is not formed, to form a current passage connected in parallel to the active layer.

The p-electrode may include an inclined etching surface between the p-type semiconductor layer and the n-type semiconductor layer, and extend from the p-type semiconductor layer to the portion of the n-type semiconductor layer where the n-electrode is not formed.

The p-electrode may be formed by plasma treatment of the p-type semiconductor layer, the active layer exposed through the etching surface, and the portion of the n-type semiconductor layer where the n-electrode is not formed, such that electric resistance of contact areas of the n-type and p-type semiconductor layers contacting the p-electrode can be changed.

The p-electrode may be formed by changing a contact area of the p-type semiconductor layer to the p-electrode and changing a contact area of the n-type semiconductor layer to the p-electrode.

Alternatively, a flip chip LED may be provided by attaching the n-electrode and the p-electrode of the LED having the current passage connected in parallel to the active layer to a sub-mount.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will become apparent from the following description of exemplary embodiments given in conjunction with the accompanying drawings, in which.

DETAILED DESCRIPTION OF THE ILLUSTRATED EMBODIMENTS

Figure 1A:
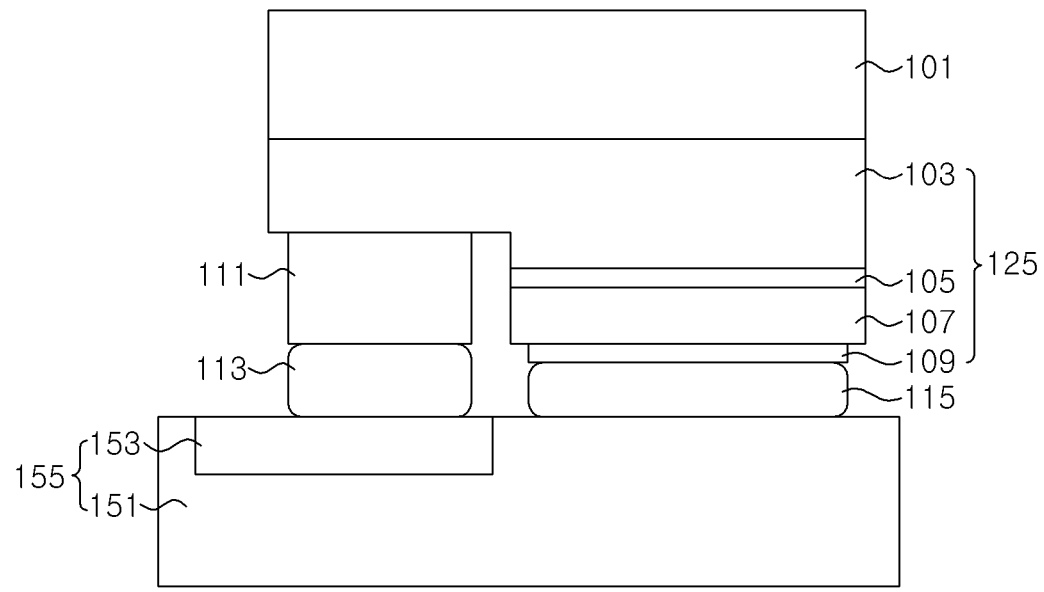
FIG. 1A is a schematic cross-sectional view of a flip-chip LED with a Zenor diode formed on a sub-mount.
Figure 1B:
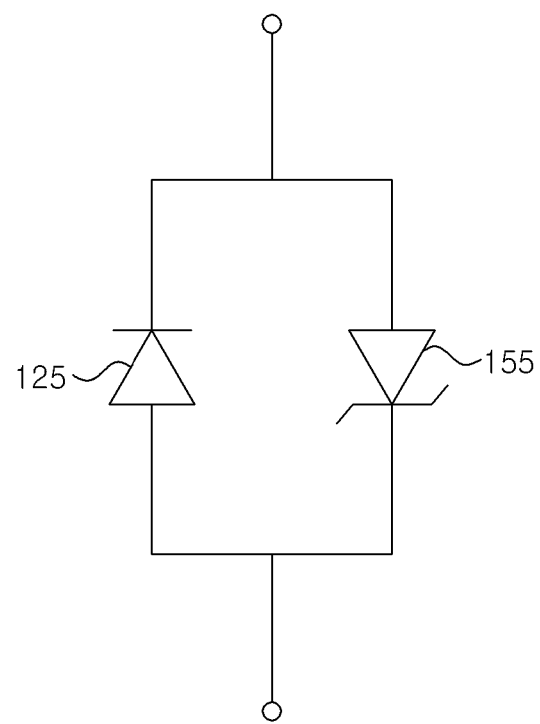
FIG. 1B is an equivalent circuit diagram of the flip-chip LED shown in FIG. 1A.

Exemplary embodiments of the present invention will be described in detail with reference to the accompanying drawings hereinafter. The embodiments are given by way of illustration for full understanding of the present invention by those skilled in the art. Hence, the present invention is not limited to these embodiments and can be realized in various forms. Further, for convenience of description, width, length, and thickness of components are not drawn to scale in the drawings. Like components are indicated by like reference numerals throughout the specification.

Figure 2:
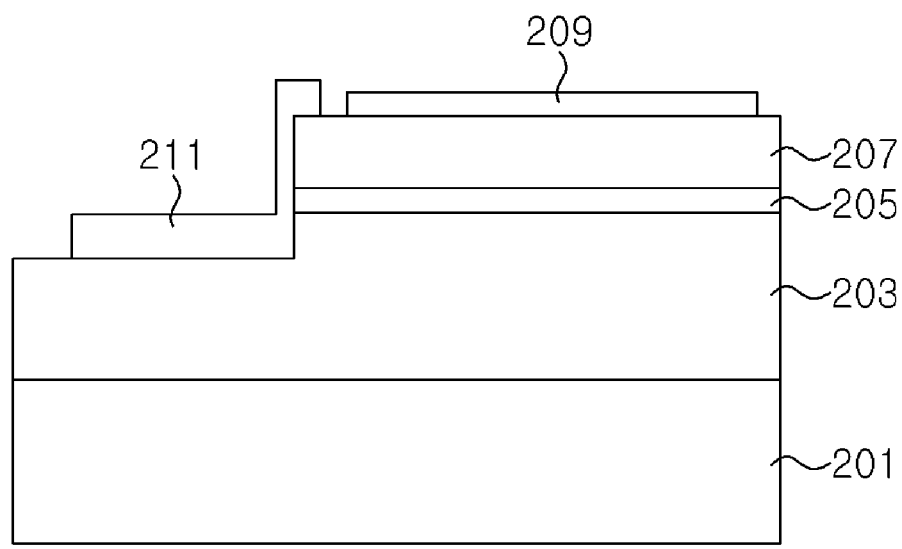
FIG. 2 is a cross-sectional view of a LED according to an embodiment of the present invention.

FIG. 2 is a cross-sectional view of an LED according to an embodiment of the present invention.

Referring to FIG. 2, the LED according to the embodiment includes a sapphire substrate 201, an n-type nitride layer 203, an active layer 205, a p-type nitride layer 207, a p-electrode 209, and an n-electrode 211 (a p-type pad is not shown). The n-electrode 211 is arranged on, and may contact, an exposed portion of the n-type nitride layer 203, and is also arranged on, and may contact, a portion of the p-type nitride layer 207 where the p-electrode 209 is not formed.

That is, the n-electrode 211 extends from a portion of the n-type nitride layer 203 to a portion of the p-type nitride layer 207, so that the LED has a current passage electrically connected in parallel to the active layer 205.

If static electricity is applied rearward to the LED, the applied static electricity flows through the current passage connected in parallel to the active layer 205 since electric resistance of the current passage is lower than an internal resistance created by a contact potential difference of the LED, thereby more effectively protecting the active layer 205 of the LED from the static electricity.

Before formation of the n-electrode 211, plasma surface treatment may be performed on the n-type nitride layer 203, the p-type nitride layer 207, or both (hereinafter any combination of one or both is referred to as "the nitride layers 203 or 207") to change the electric resistance of the nitride layers 203 or 207 where the n-electrode 211 will be formed. Particularly, the plasma surface treatment on the p-type nitride layer 207 can cause an increase in the electric resistance.

The plasma surface treatment can be performed in any vacuum chamber, such as a reactive ion etching (RIE) chamber, an inductively coupled plasma (ICP) chamber, an electron cyclotron resonance (ECR) chamber, and the like, which can generate plasma. A plasma gas includes at least one selected from the group consisting of N, NO, NH, He, Ne, Ar, and combinations thereof. The plasma surface treatment of the nitride layers 203 or 207 may be performed for ten minutes or less by applying a power in the range of 1~200 W to generate plasma.

Particularly, if performing the plasma treatment of the p-type nitride layer 207 disposed on the active layer 205, the surface of the p-type nitride layer 207 may be subjected to the plasma treatment for less than sixty seconds at 25 W with nitrogen-based plasma to prevent the active layer 205 from being damaged by the plasma treatment.

In the plasma treatment, the electric resistance of the nitride semiconductor is proportional to power and duration of plasma treatment. Further, the n-electrode 211 contacting the plasma treated surfaces of the nitride layers 203 or 207 has an increased contact resistance on a contact surface of the n-electrode 211 to the nitride semiconductor layers 203 or 207. Hence, it is possible to control electric characteristics of the current passage formed of the n-electrode 211 that extends from the exposed portion of the n-type nitride layer 203 to the portion of the p-type nitride layer 207 where the p-electrode 209 is not formed.

With the current passage connected in parallel to the active layer 205 of the LED, the LED can reduce current leakage, better maintain electrical drive characteristics of the diode, and provide a bypass for static electricity applied from the outside, thereby better providing an anti-static electricity function.

The contact resistance of the n-electrode 211 contacting the nitride layers 203 or 207 can be changed by disposing insulation films such as $SiO_2$ films or SiN films on the n-type nitride layer 203, a mesa side including the active layer 205, and the p-type nitride layer 207 that will contact the n-electrode 211, instead of the plasma treatment on the nitride layers 203 or 207.

The contact resistance of the n-electrode 211 contacting the nitride layers 203 or 207 can also be changed by disposing the insulation films such as $SiO_2$ films or SiN films on the n-type nitride layer 203, the mesa side including the active layer 205, and the p-type nitride layer 207 that will contact the n-electrode 211, after the plasma treatment on the nitride layers 203 or 207.

Further, the contact resistance of the n-electrode 211 contacting the nitride layers 203 or 207 can also be changed by changing a contact area of the n-electrode 211 to the nitride layers 203 or 207 along with the plasma treatment on the contact surfaces of the nitride layers 203 or 207 where the n-electrode 211 will be formed. In particular, change in contact area of the n-electrode 211 to the p-type nitride layer 207 may heavily influence change in the contact resistance.

Since a decrease in contact area of the n-electrode 211 to the nitride layers 203 or 207 causes an increase in contact resistance of the n-electrode 211, it is possible to control the electric characteristics of the current passage created by formation of the n-electrode 211 that extends from the exposed portion of the n-type nitride layer 203 to the portion of the p-type nitride layer 207 where the p-electrode 209 is not formed.

The p-electrode 209 may be formed of a conductive oxide film or a transparent metallic film such as Ni/Au, and the n-electrode 211 may be formed of a material selected from the group consisting of Ti, Al, Pt, Pd, Au, Cr, Fe, Cu, Mo, and combinations thereof.

Figure 3:
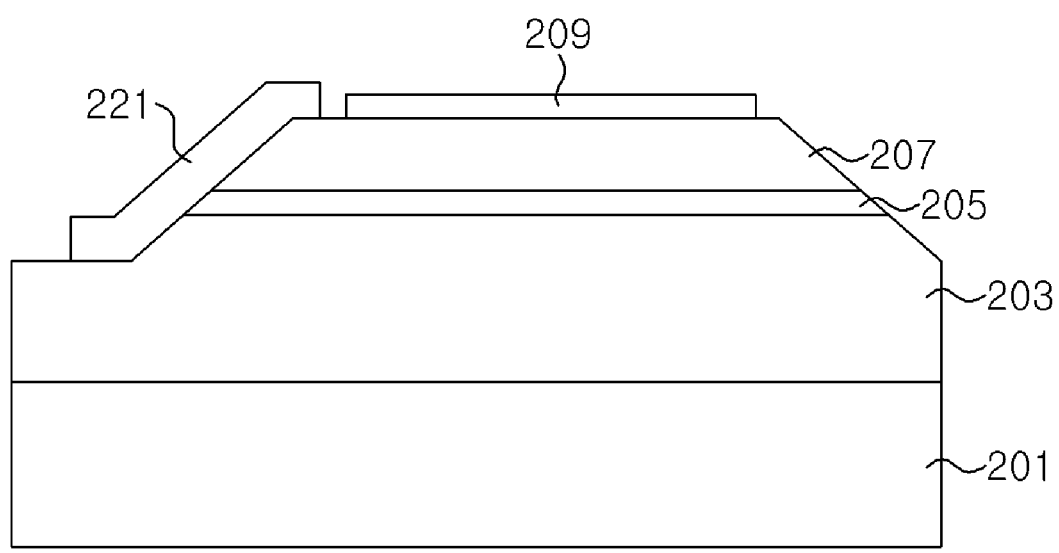
FIG. 3 is a cross-sectional view of a LED according to another embodiment of the present invention.

FIG. 3 is a cross-sectional view of a LED according to another embodiment of the present invention.

Referring to FIG. 3, the LED according to an embodiment includes a sapphire substrate 201, an n-type nitride layer 203, an active layer 205, a p-type nitride layer 207, a p-electrode 209, and an n-electrode 221 (a p-type pad is not shown). Here, the n-type nitride layer 207 is exposed by etching, and specifically, by dry etching using a photoresist as an etching mask to provide a mesa structure to the LED as shown in FIG. 3. The photoresist is subjected to a thermal reflow process to achieve a circular shape.

The n-electrode 221 is arranged on, and may contact, an exposed portion of the n-type nitride layer 203 and is arranged on, and may contact, a portion of the p-type nitride layer 207 where the p-electrode 209 is not formed.

The p-electrode 209 may be formed of a conductive oxide film or a transparent metallic film such as Ni/Au, and the n-electrode 221 may be formed of a material selected from the group consisting of Ti, Al, Pt, Pd, Au, Cr, Fe, Cu, Mo, and combinations thereof.

As such, the n-electrode 221 extends from the n-type nitride layer 207 to the portion of the p-type nitride layer 209, so that the LED has a current passage electrically connected in parallel to the active layer 205.

Before formation of the n-electrode 221, plasma surface treatment may be performed on the nitride layers 203 or 207 to change the electric resistance of the nitride layers 203 or 207 where the n-electrode 221 will be formed. Particularly, the plasma surface treatment on the p-type nitride layer 207 can cause a rapid increase in the electric resistance.

The plasma surface treatment can be performed in any vacuum chamber, such as a reactive ion etching (RIE) chamber, an inductively coupled plasma (ICP) chamber, an electron cyclotron resonance (ECR) chamber, and the like, which can generate plasma. A plasma gas includes at least one selected from the group consisting of N, NO, NH, He, Ne, Ar, and combinations thereof. The plasma surface treatment of the nitride layers 203 or 207 is performed for ten minutes or less by applying a power in the range of 1~200 W to generate plasma.

Particularly, if performing the plasma treatment of the p-type nitride layer 207 disposed on the active layer 205, the surface of the p-type nitride layer 207 may be subjected to the plasma treatment for less than sixty seconds at 25 W with nitrogen-based plasma to prevent the active layer 205 from being damaged by the plasma treatment.

In the plasma treatment, the electric resistance of the nitride semiconductor is proportional to power and duration of plasma treatment. Further, the n-electrode 221 contacting the plasma treated surfaces of the nitride layers 203 or 207 has an increased contact resistance on a contact surface of the n-electrode 221 to the nitride semiconductor layers 203 or 207. Hence, it is possible to control electric characteristics of the current passage created by formation of the n-electrode 221 that extends from the exposed portion of the n-type nitride layer 203 to the portion of the p-type nitride layer 207 where the p-electrode 209 is not formed.

With the current passage connected in parallel to the active layer 205 of the LED, the LED can reduce current leakage, normally maintain electrical drive characteristics of the diode, and provide a bypass for static electricity applied from the outside, thereby better providing an anti-static electricity function.

The contact resistance of the n-electrode 221 contacting the nitride layers 203 or 207 can be changed by disposing insulation films such as $SiO_2$ films or SiN films on the n-type nitride layer 203, a mesa side including the active layer 205, and the p-type nitride layer 207 that will contact the n-electrode 221, instead of the plasma treatment on the nitride layers 203 or 207.

The contact resistance of the n-electrode 221 contacting the nitride layers 203 or 207 can also be changed by disposing insulation films such as $SiO_2$ films or SiN films on the n-type nitride layer 203, the mesa side including the active layer 205, and the p-type nitride layer 207 that will contact the n-electrode 221, after the plasma treatment on the nitride layers 203 or 207.

Further, the contact resistance of the n-electrode 221 contacting the nitride layers 203 or 207 can also be changed by changing a contact area of the n-electrode 221 to the nitride layers 203 or 207 along with the plasma treatment on the contact surfaces of the nitride layers 203 or 207 where the n-electrode 221 will be formed. In particular, change in contact area of the n-electrode 221 to the p-type nitride layer 207 will heavily influence change in the contact resistance.

Since a decrease in contact area of the n-electrode 221 to the nitride layers 203 or 207 causes an increase in contact resistance of the n-electrode 221, it is possible to control the electric characteristics of the current passage created by formation of the n-electrode 221 that extends from the exposed portion of the n-type nitride layer 203 to the portion of the p-type nitride layer 207 where the p-electrode 209 is not formed.

For the LED with the sloped mesa structure as shown in FIG. 3, the active layer 205 is exposed toward an upper surface of the LED. Thus, an exposed surface of the active layer 205 may be more effectively insulated than a vertical mesa structure during the plasma treatment, and can be prevented from directly contacting the n-electrode 221, thereby improving reliability of the LED even if the LED is driven for a long period of time. Further, if forming the n-electrode 221 from the exposed portion of the n-type nitride layer 203 to the portion of the p-type nitride layer 207 where the p-electrode 209 is not formed, the n-electrode 221 is formed on an etching surface having a gentle slope, thereby preventing step coverage in formation of the n-electrode 221 while improving light extraction efficiency and luminescence efficiency in the case of manufacturing a flip chip type LED.

Figure 4:
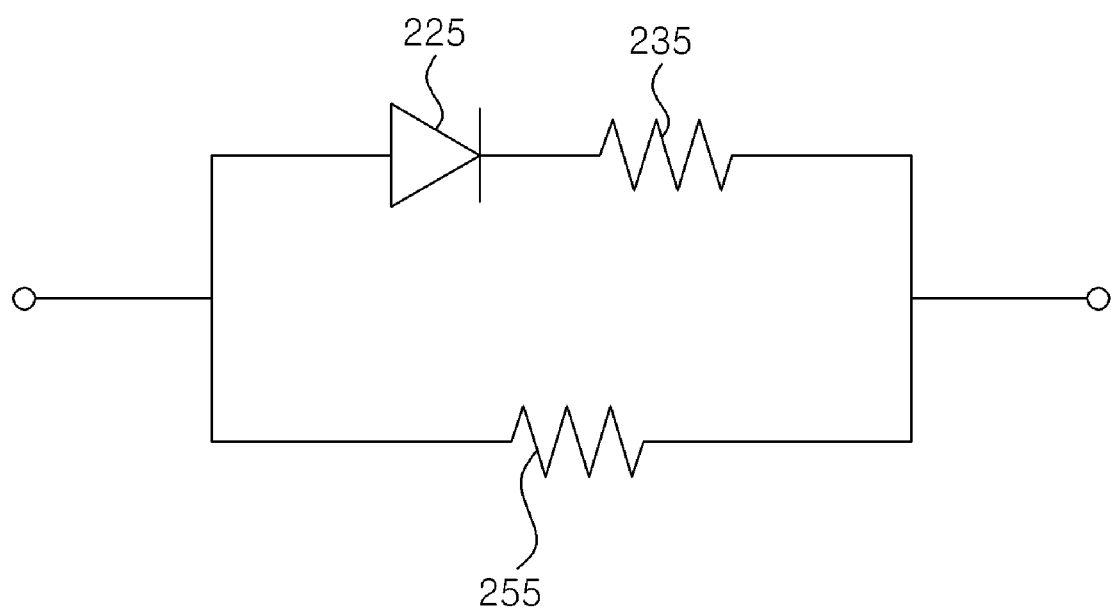
FIG. 4 is an equivalent circuit diagram of the LEDs shown in FIG. 2 and FIG. 3.

FIG. 4 is an equivalent circuit diagram of the LEDs shown in FIG. 2 and FIG. 3.

Referring to FIG. 4, a resistor 235 connected in series to the LED 225 represents resistant components that include internal resistance, such as a junction potential difference of an active layer, and contact resistance between semiconductor and metal. A resistor 255 connected in parallel to the LED 225 represents resistance of a current passage created by the n-electrode 211 or 221 that is formed from an exposed portion of the n-type nitride layer 203 to the portion of the p-type nitride layer 207 where the p-electrode 209 is not formed.

The resistance of resistor 255 of the current passage can be determined by plasma treatment of the nitride semiconductor layers and the contact area of the electrode contacting the nitride semiconductor layers. The resistance of resistor 255 of the current passage determines electrical characteristics and electrostatic discharge limitations of the LED.

Although the n-electrode 211 and 221 is illustrated as being disposed only on a left side of the LED in the embodiments shown in FIG. 2 and FIG. 3, the present invention is not limited to this configuration. The n-electrode 211 or 221 may be provided in a symmetrical manner on the LED, or may be provided to entirely surround the LED. Further, although each LED shown in FIG. 2 and FIG. 3 is illustrated as having the n-type nitride layer 203, active layer 205, and p-type nitride layer 207 sequentially formed in this order on the sapphire substrate 201, the present invention is not limited to this configuration. The present invention can also be applied to a LED having a p-type nitride layer, an active layer, and an n-type nitride layer sequentially formed on a sapphire substrate.

As apparent from the above description, according to the exemplary embodiments of the present invention, the LED includes a current passage connected in parallel to an active layer without a separate Zenor diode. Therefore, the LED according to the exemplary embodiments of the present invention permits reduction in the number of packaging processes and manufacturing costs, and can prevent electrostatic discharge, which can be caused by static electricity induced from the outside, thereby reducing the risk of damage to the LED by reverse current while improving reliability of the LED.

Further, plasma treatment and variation in contact area of an electrode may vary the electric resistance of the current passage, thereby better providing an anti-static electricity function and optimal operation of the LED.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode, comprising:
   an n-type nitride semiconductor layer;
   an active layer arranged on the n-type nitride semiconductor layer;
   a p-type semiconductor layer arranged on the active layer;
   a p-electrode arranged on the p-type semiconductor layer; and
   an n-electrode arranged on an exposed portion of the n-type semiconductor layer and arranged on a portion of the p-type semiconductor layer,
   wherein the entire n-electrode comprises a conductive material, and
   wherein the n-electrode directly contacts an upper surface and a side surface of the p-type semiconductor layer.

2. The light emitting diode according to claim 1, wherein the exposed portion of the n-type semiconductor layer and the p-type semiconductor layer include an inclined etching surface and the active layer is exposed to the inclined etching surface.

3. The light emitting diode according to claim 1, wherein the exposed portion of the n-type semiconductor layer, the portion of the p-type semiconductor layer, or both are subjected to plasma treatment to change electrical characteristics.

4. The light emitting diode according to claim 3, wherein the plasma treatment is performed using a gas comprising N, NO, NH, He, Ne, Ar, or a combination thereof.

5. The light emitting diode according to claim 3, wherein the electrical characteristics of the semiconductor layer or semiconductor layers subjected to the plasma treatment are varied according to applied power of the plasma treatment.

6. The light emitting diode according to claim 3, wherein the electrical characteristics of the semiconductor layer or semiconductor layers subjected to the plasma treatment are varied according to treatment duration of the plasma treatment.

7. The light emitting diode according to claim 3, wherein the electrical characteristics of the semiconductor layer or semiconductor layers subjected to the plasma treatment are varied according to treatment duration and applied power of the plasma treatment.

8. The light emitting diode according to claim 3, further comprising:
   a reflective plate arranged on the p-electrode,
   wherein the reflective plate and the n-electrode are attached to a sub-mount to constitute the light emitting diode as a flip chip type light emitting diode.

9. The light emitting diode according to claim 1, further comprising an insulation film arranged on the exposed portion of the n-type semiconductor layer, an inclined surface including the active layer, and the portion of the p-type semiconductor layer.

10. The light emitting diode according to claim 1, wherein the n-type semiconductor layer, the active layer, and the p-type semiconductor layer each comprise nitride-based semiconductor materials.

11. The light emitting diode according to claim 1, wherein the n-electrode comprises Ti, Al, Pt, Pd, Au, Cr, Fe, Cu, Mo, or a combination thereof.

12. The light emitting diode according to claim 1, wherein the n-electrode comprises a current passage connected in parallel to the active layer.

13. The light emitting diode according to claim 1, wherein contact resistance between the n-electrode and the semiconductor layers are determined by contact areas between the n-electrode and the semiconductor layers.

14. The light emitting diode according to claim 1, wherein the upper surface of the p-type semiconductor layer is continuous.

15. The light emitting diode according to claim 14, wherein the p-electrode and the n-electrode are both arranged on the continuous upper surface of the p-type semiconductor.

* * * * *